United States Patent [19]

Van Zalinge et al.

[11] Patent Number: 5,757,209

[45] Date of Patent: May 26, 1998

[54] EXTREMUM VOLTAGE SUPPLY CIRCUIT WITH IMPROVED SWITCHING

[75] Inventors: Klaas Van Zalinge, Meylan; Serge Hembert, Crolles, both of France

[73] Assignee: SGS-Thomson Microelectronics S.A., Saint Genis, France

[21] Appl. No.: 573,898

[22] Filed: Dec. 18, 1995

[30] Foreign Application Priority Data

Dec. 21, 1994 [FR] France ............... 94 15671

[51] Int. Cl.$^6$ ............... G01R 19/00; H03K 5/153
[52] U.S. Cl. ............... 327/58; 327/482
[58] Field of Search ............... 327/54, 58, 62, 327/63, 65, 67, 70, 108, 333, 374, 378, 391, 489, 491, 538, 543, 432

[56] References Cited

U.S. PATENT DOCUMENTS

| | | | |
|---|---|---|---|
| 3,348,072 | 10/1967 | Marcus et al. | 307/88.5 |
| 3,678,513 | 7/1972 | Ward, Jr. | 340/414 |
| 4,716,305 | 12/1987 | Sakuragi et al. | 327/491 |
| 4,937,670 | 6/1990 | Whitledge | 327/58 |
| 5,159,211 | 10/1992 | Fujii | 327/58 |
| 5,319,251 | 6/1994 | Gotz | 327/478 |
| 5,436,581 | 7/1995 | Oberhauser | 327/432 |
| 5,469,090 | 11/1995 | Narahara | 327/58 |
| 5,469,104 | 11/1995 | Smith et al. | 327/491 |

FOREIGN PATENT DOCUMENTS

A-0 584 402  3/1994  European Pat. Off.
A-1 241 454  8/1971  United Kingdom.

OTHER PUBLICATIONS

Patent Abstracts of Japan, vol. 11, No. 212 (E-522), Jul. 9, 1987 & JP-A-62 034416 (Victor Co. Of Japan Ltd.) Feb. 14, 1987.

Patent Abstracts of Japan, vol. 16, No. 453 (E-1267) Sep. 21, 1992 & JP-A-04 158687 (Toshiba Corp.) Jun. 1, 1992.

IBM Technical Disclosure Bulletin, vol. 27, No. 5, Oct. 1984 New York, US. pp. 2908-2910. "Maximum and Minimum Voltage Detection".

*Primary Examiner*—Timothy P. Callahan
*Assistant Examiner*—My-Trang Nu Ton
*Attorney, Agent, or Firm*—Wolf, Greenfield & Sacks, P.C.; James H. Morris

[57] ABSTRACT

The present invention relates to a circuit for supplying the extremum voltage among several input voltages, including, for each input voltage, a first bipolar transistor, the base of which receives the input voltage and the emitter of which is connected to a common output supplying the extremum voltage; a first current source for biasing the emitter of the first transistor; and switching means for disconnecting the first source from the first transistor when this transistor is blocked.

27 Claims, 2 Drawing Sheets

EXTREMUM VOLTAGE SUPPLY CIRCUIT WITH IMPROVED SWITCHING

BACKGROUND OF THE INVENTION

1. Field of the Invention

The present invention relates to a circuit for supplying the highest voltage or the lowest voltage (extremum voltage) among several input voltages.

Such a circuit is most often used to generate a voltage with a complex shape by means of several voltages with simple shapes. Particularly, in the field of television, such a circuit is used to give a particular shape to the transitions of the chrominance signals, which improves the visual impression of the images.

2. Discussion of the Related Art

FIG. 1 shows a conventional circuit for supplying the highest, Vmax, of two input voltages V1 and V2. This circuit includes two NPN transistors Q1 and Q2, respectively receiving voltages V1 and V2 on their bases. The collectors of these transistors are connected to a high supply voltage Vcc and the emitters supply the maximum voltage Vmax and are connected to the ground GND through a current source 10 pulling a steady current 2I0.

When one of the voltages, for example V1, is higher than the other, V2, the corresponding transistor Q1 behaves as a follower and its emitter voltage Vmax follows changes in voltage V1. The base-emitter junction of the other transistor Q2 is reverse biased, which blocks the transistor. All the current 2I0 then runs through transistor Q1.

When voltages V1 and V2 are equal, transistors Q1 and Q2 both conduct. The current of source 10 is distributed between transistors Q1 and Q2; that is, a current I0 runs through each of the transistors. By connecting other transistors in parallel to transistors Q1 and Q2, a circuit for supplying the highest voltage among three or more input voltages is achieved.

FIG. 2 illustrates a disadvantage of the circuit in FIG. 1. FIG. 2 shows various values of voltages V1 and V2 over-time and the corresponding value of the output Vmax. FIG. 2 shows steep voltage transitions in voltages V1 and V2. However, in practice, these voltage transitions are more gradual.

Up to time t1, voltages V1 and V2 are at the same initial value Vi. From time t1, voltage V1 increases until a time t2 where it reaches a final value Vf. Voltage V2 increases from a time t3 to a time t4 where this voltage V2 reaches the value Vf.

Up to time t1, voltage Vmax is at a voltage equal to Vi less the base-emitter voltage Vbe of transistors Q1 and Q2. Transistors Q1 and Q2 both conduct and a current I0 runs through both of them (the current of source 10 is uniformly distributed between transistors Q1 and Q2).

Between times t1 and t4, voltage V1 is higher than voltage V2. Therefore, transistor Q2 is blocked and transistor Q1 is the only one to conduct. All the current, 2I0, of source 10 runs through transistor Q1, which increases the Vbe voltage of transistor Q1. As voltage Vmax follows changes in voltage V1 less the Vbe voltage of transistor Q1, Vmax is offset downwards, as shown. This offset of output voltage Vmax is proportional to the natural logarithm of the ratio of the maximum current of the transistor (Q1) to its minimum non-zero current. In the worst case, this ratio is equal to the number of voltages to process. In the example of FIG. 2, two voltages are being processed, and the offset is approximately 20 millivolts. This offset, of a steady value, is even more significant when the level of the input signals is low.

SUMMARY OF THE INVENTION

It is an object of the present invention to provide a circuit for supplying an extremum voltage with an offset-free output when at least two input voltages switch between an equal state and a different state.

This object may be achieved by means of cells respectively associated with the input voltages, which ensure that a steady current runs through each transistor that is delivering the extremum voltage on a common output line. This result may be achieved by providing either that each cell supplies no current on the common line when its transistor is blocked, or that any excess current sourced or sinked on the common line is provided without substantially affecting the current conducted by an extremum voltage following transistor of an active cell.

An illustrative embodiment of a cell includes a first bipolar transistor having its base receiving the input voltage and its emitter being connected to a common output supplying the extremum voltage; a first current source for biasing the emitter of the first transistor; and switching means for disconnecting the first source from the first transistor when this transistor is blocked.

According to an illustrative embodiment of the invention, a cell includes a second transistor of the same type as the first one, connected in parallel by its base and its collector to the first transistor, and the emitter of which is connected to a supply voltage through a second current source with a value of half that of the first current source. A third transistor of the same type as the first one has its collector connected to the emitter of the first transistor, its base connected to the emitter of the second transistor, and its emitter connected to the supply voltage through the first current source. A fourth transistor forms a differential stage with the third one, and has its base connected to the emitter of the first transistor.

In another illustrative embodiment of the invention, a cell includes a first bipolar transistor, the base of which receives the input voltage and the emitter of which is connected to a common output supplying the extremum voltage; a first current source for biasing the emitter of the first transistor; and means for deriving outside the first transistor any current in excess from that of the first current source, when the first transistor is on.

According to an embodiment of the invention, a cell includes a second current source connecting the collector of the first transistor to a first supply voltage and a second transistor connected between the first voltage and the emitter of the first transistor, turned on when the first transistor is on.

According to an embodiment of the invention, the second transistor is a MOS transistor, the gate of which is connected to the collector of the first transistor, the source of which is connected to the first voltage, and the drain of which is connected to the emitter of the first transistor.

The foregoing and other objects, features and advantages of the present invention, as well as others, will be discussed in the following description of specific embodiments, taken in conjunction with the accompanying drawings but not limited by them.

DETAILED DESCRIPTION

Figure 1:
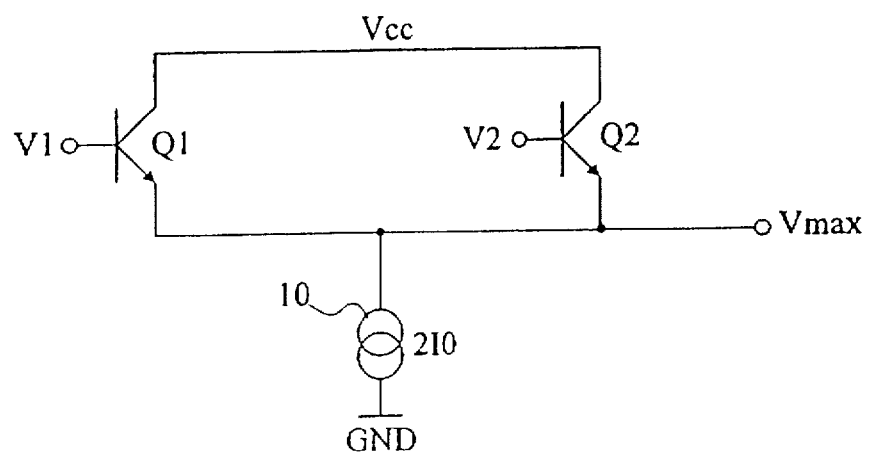
FIG. 1 is a conventional circuit for supplying the highest voltage among several input voltages.
Figure 2:
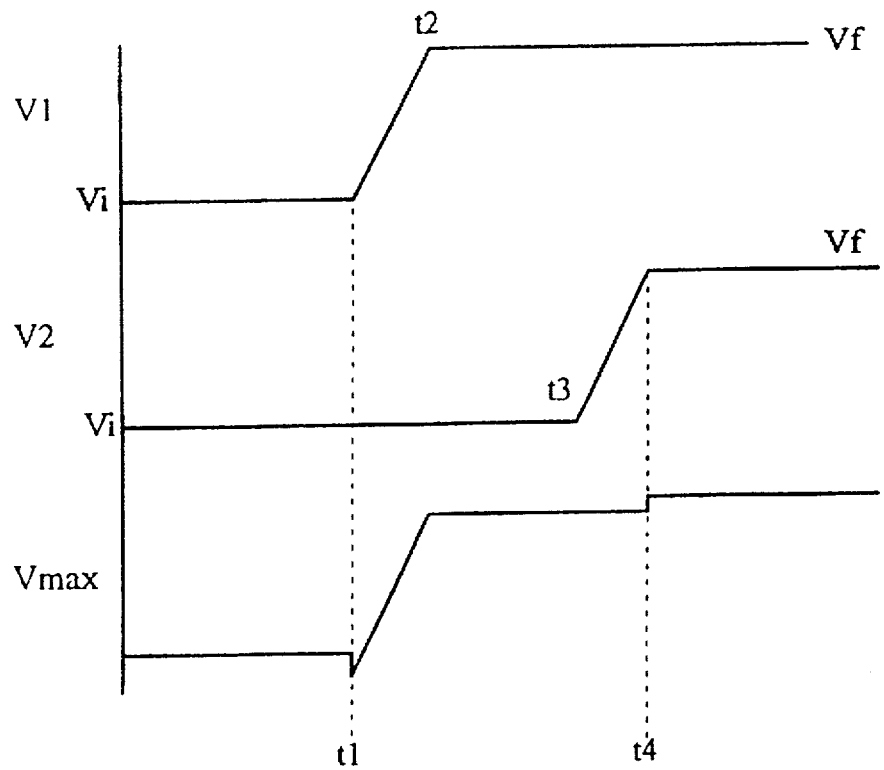
FIG. 2 is a waveform diagram illustrating the operation of the circuit in FIG. 1.
Figure 3:
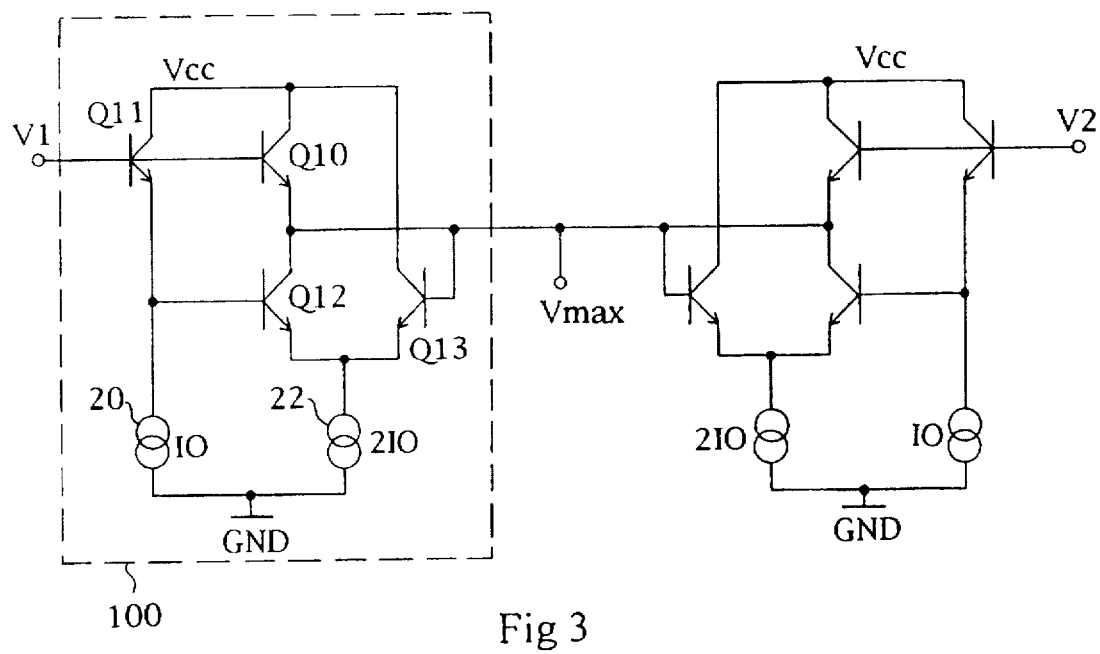
FIG. 3 illustrates a first embodiment of a cell for achieving a circuit supplying the extremum voltage.
Figure 4:
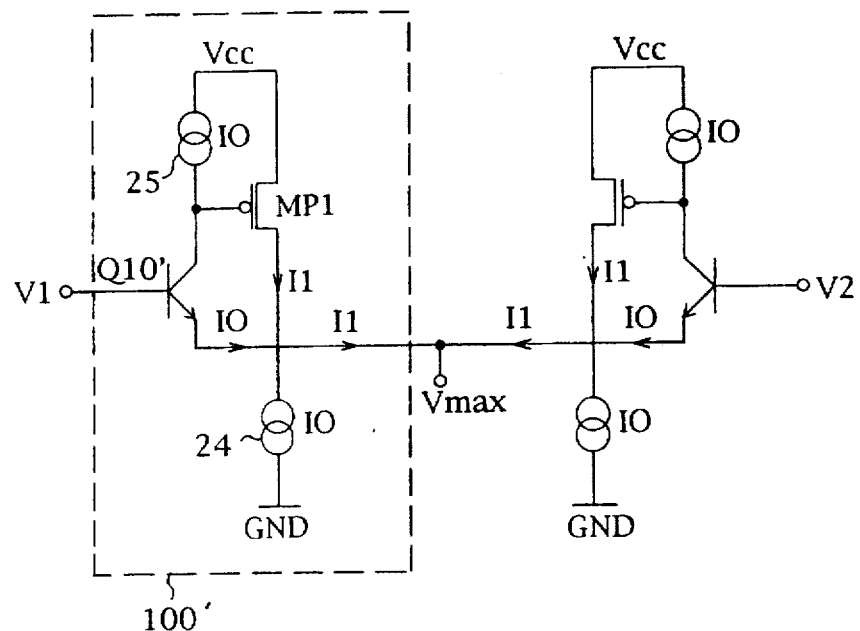
FIG. 4 illustrates a second embodiment of a cell according to the invention.

A cell 100 of the type shown in FIG. 3 or in FIG. 4 is associated with each input voltage V1, V2 in order to achieve a circuit for supplying the lowest voltage or, in the embodiments described, the highest voltage among the input voltages. To achieve a circuit for supplying the lowest voltage, the cells are made in a similar manner by inverting the type of the transistors.

In the embodiment of FIG. 3, the cell 100 includes an NPN transistor Q10 receiving on its base the input voltage V1 associated with the cell. The collector of transistor Q10 is connected to a high supply voltage Vcc and its emitter is connected to a line Vmax that is common to all the cells in the circuit. The line Vmax supplies the extremum voltage, which is a maximum voltage in this example. Voltage V1 is also supplied to the base of an NPN transistor Q11 connected in parallel by its base and its collector to transistor Q10. The emitter of transistor Q11 is coupled to ground GND by a current source 20 pulling a current I0.

The emitter of transistor Q10 is connected to the collector of an NPN transistor Q12, the base of which receives the emitter voltage of transistor Q11, and the emitter of which is coupled to ground through a current source 22 pulling a current 2I0. An NPN transistor Q13 forms a differential stage with transistor Q12. This transistor Q13 has its emitter connected to the emitter of transistor Q12, its base connected to the emitter of transistor Q10, and its collector connected to supply voltage Vcc.

When voltage V1 is higher than the other input voltages for example, input voltage V2, transistor Q10 acts as a follower and voltage Vmax is equal to voltage V1 less the base-emitter voltage Vbe0 of transistor Q10. Transistor Q11 also acts as a follower and the voltage V1 less the base-emitter voltage Vbe0 of transistor Q11 appears on the base of transistor Q12. Thus, the differential stage Q12, Q13 receives two voltages which are almost equal to each other, which causes a uniform distribution of the current of source 22 in transistors Q12 and Q13. As a result, a current I0 runs through transistor Q10, which is the same current as that running through transistor Q11. Thus, the base-emitter voltages of transistors Q10 and Q11 are equal to each other, which only confirms the state of balance of stage Q12, Q13. This state of the cell 100 of FIG. 3 is not altered by the other input voltages (e.g., V2) becoming equal to voltage V1, since the output voltage Vmax, which determines the state of balance of the differential stage Q12, Q13, is not altered.

Now, when voltage V1 becomes lower than the other input voltages (e.g., V2), the transistor Q12 of the differential stage receives on its base a voltage lower than the base voltage Vmax of transistor Q13. The differential stage is therefore unbalanced, and all the current of source 22 runs through transistor Q13. Thus, the current which cannot be conducted by transistor Q10 is not supplied on line Vmax to the equivalent of transistor Q10 in another cell.

In operation, the differential stage Q12, Q13 acts like a switch that prevents the supplying of a current (I0) on the common line Vmax when transistor Q10 can no longer conduct this current.

FIG. 4 shows another embodiment of a cell 100 according to the invention. The input voltage V1 associated with the cell is supplied to the base of an NPN transistor Q10', the emitter of which is connected to the common output line Vmax. The emitter of transistor Q10' is coupled to ground GND through a current source 24 pulling a current I0, and its collector is coupled to voltage Vcc through a current source 25 pushing a same current I0. A p-channel MOS transistor MP1 has its gate connected to the collector of transistor Q10', its drain connected to line Vmax, and its source connected to voltage Vcc. Transistor MP1 preferably is a MOS transistor, but it could also be a bipolar PNP transistor.

When voltage V1 is higher than or equal to the other input voltages for example, input voltage V2, transistor Q10' conducts. Its current is forced to value I0 by source 25 and is entirely sinked by source 24. Transistor MP1 is turned on by transistor Q10', but a current I1 runs through it only if this current I1 is drawn through line Vmax. This current I1 is, for example, the current consumed by a load connected to line Vmax, or by the equivalent of the current source 24 of a cell associated with an input voltage lower than voltage V1.

When the input voltage V1 is lower than that of the other cells, transistors Q10' and MP1 are blocked and the current of source 24 is pulled from line Vmax. This current is then compensated by the equivalent of transistor MP1 in a cell associated with a maximum input voltage.

Thus, the cell 100 in FIG. 4 also ensures that a steady current runs through transistor Q10' when it conducts. In fact, the operating principle of the cell 100 in FIG. 4 is complementary to that of the cell 100 in FIG. 3. Instead of disconnecting a current source from line Vmax when the cell becomes inactive, the current source is allowed to pull a current from line Vmax, and this additional current is provided independent of the current conducted by the transistors Q10' of the active cells.

A current source 24, of a current of value I0, associated with each cell, has been described in relation with FIG. 4. Of course, if a circuit is achieved by means of n cells, the n sources 24 are connected in parallel; in practice, they are achieved by means of a single source pulling a current n I0.

Of course, the present invention is likely to have various alterations and modifications which will readily occur to those skilled in the art. Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A method of providing an extremum output voltage from first and second input voltages, the method being performed in an electronic circuit and comprising the steps of:

deriving the extremum output voltage from the first input voltage when the first input voltage is an extremum of the first and second input voltages, the step of deriving the extremum output voltage from the first input voltage being performed in a first circuit;

ceasing to derive the extremum output voltage from the first input voltage in the first circuit when the first input voltage is no longer the extremum of the first and second input voltages, the step of ceasing to derive the extremum output voltage from the first input voltage being performed in the first circuit;

deriving the extremum output voltage from the second input voltage in a second circuit when the second input voltage is the extremum of the first and second input voltages, the step of deriving the extremum output voltage from the second input voltage being performed in a second circuit; and controlling the step of deriving from the second input voltage to isolate the step of deriving from the second input voltage from effects of the step of ceasing to derive, the step of controlling the step of deriving including a step of switching a first current that flows in a first portion of the first circuit when the first input voltage is the extremum of the first and second input voltages to flow in a second portion of the first circuit responsive to the step of ceasing.

2. The method of claim 1, wherein the step of deriving the extremum output voltage from the first input voltage includes a step of following the first input voltage when the first input voltage is the extremum of the first and second input voltages.

3. The method of claim 2, wherein the first portion of the first circuit has an input to receive the first input voltage, has an output to provide the extremum output voltage, and the first current has an approximately steady value when the first input voltage is the extremum of the first and second input voltages; and the step of deriving the extremum output voltage from the second input voltage is performed by a first portion of the second circuit that has an input to receive the second input voltage, an output to provide the extremum output voltage, and has a second current of an approximately steady value when the second input voltage is the extremum of the first and second input voltages.

4. The method of claim 3, wherein the step of switching is performed by a second portion of the first circuit that is responsive to the first portion, the second portion preventing the first current from affecting the second circuit when the first input voltage is no longer the extremum of the first and second input voltages.

5. The method of claim 4, wherein the step of preventing keeps the first current of the first circuit from substantially changing the approximately steady value of the second current in the second circuit.

6. The method of claim 5, wherein the second portion of the first circuit balances the first current in the first portion of the first circuit with a current in the second portion of the first circuit when the first input voltage is the extremum of the first and second input voltages.

7. The method of claim 1, further comprising steps of:

ceasing to derive the extremum output voltage from the second input voltage in the second circuit when the second input voltage is no longer the extremum of the first and second input voltages; and switching a second current that flows in a first portion of the second circuit when the second input voltage is the extremum of the first and second input voltages to flow in a second portion of the second circuit responsive to the step of ceasing to derive from the second input voltage.

8. The method of claim 1, wherein the first portion of the first circuit has an input to receive the first input voltage, has an output to provide the extremum output voltage, and the first current has an approximately steady value when the first input voltage is the extremum of the first and second input voltages; and the step of deriving the extremum output voltage from the second input voltage is performed by a first portion of the second circuit that has an input to receive the second input voltage, an output to provide the extremum output voltage, and has a second current of an approximately steady value when the second input voltage is the extremum of the first and second input voltages.

9. The method of claim 1, wherein the step of switching is performed by a second portion of the first circuit that is responsive to the first portion, the second portion preventing the first current from affecting the second circuit when the first input voltage is no longer the extremum of the first and second input voltages.

10. A circuit that provides an extremum voltage from a plurality of input voltages, comprising, for each of the plurality of input voltages:

a first bipolar transistor having a base that receives a respective one of the plurality of input voltages, having a collector, and having an emitter that is connected to a common output of the circuit, the common output providing the extremum voltage;

a first constant current source coupled to the common output and a first supply voltage;

a second constant current source coupling the collector of the first bipolar transistor to a second supply voltage; and a MOS transistor, having a gate that is connected to the collector of the first bipolar transistor, having a source that is connected to the second supply voltage, and having a drain that is connected to the emitter of the first bipolar transistor.

11. The circuit of claim 10, wherein:

the extremum voltage is a maximum voltage, the first bipolar transistor is an NPN transistor, and the MOS transistor is a p-channel MOS transistor.

12. A circuit that provides an extremum voltage from a plurality of input voltages, comprising, for each of the plurality of input voltages:

a first bipolar transistor having a base that receives a respective one of the plurality of input voltages, having a collector that is coupled to a first supply voltage, and having an emitter that is connected to a common output of the circuit, the common output providing the extremum voltage;

a first current source coupled to a second supply voltage; and switching means, for connecting the emitter of the first bipolar transistor to the first current source when the first bipolar transistor is on and for disconnecting the emitter of the first bipolar transistor from the first current source when the first bipolar transistor is off.

13. The circuit of claim 12, wherein the first current source has a value, and the switching means includes:

a second bipolar transistor having a base, a collector, and an emitter, the base of the second bipolar transistor being connected to the base of the first bipolar transistor, the collector of the second bipolar transistor being connected to the collector of the first bipolar transistor, and the emitter of the second bipolar transistor being electrically coupled to the second supply voltage through a second current source having a second value, the second value being one half the value of the first current source;

a third bipolar transistor having a base, a collector, and an emitter, the base of the third bipolar transistor being electrically coupled to the emitter of the second bipolar transistor, the collector of the third bipolar transistor being electrically coupled to the emitter of the first bipolar transistor, and the emitter of the third bipolar transistor being electrically coupled to the second supply voltage through the first current source; and a fourth bipolar transistor forming a differential stage with the third bipolar transistor, the fourth bipolar transistor having a base that is electrically coupled to the emitter of the first bipolar transistor.

14. The circuit of claim 13, wherein the extremum voltage is a maximum voltage, and the first, second, third, and fourth bipolar transistors are NPN transistors.

15. A circuit for providing an extremum voltage from a plurality of input voltages, the circuit comprising:

a first transistor having an input that is electrically coupled to a first of the plurality of input voltages and having a first output;

a second transistor having an input that is electrically coupled to a second of the plurality of input voltages and having a first output, the first output of the second transistor being electrically coupled to the first output of the first transistor to provide the extremum voltage;

a first switched current source that is electrically coupled to the first output of the first transistor, the first switched current source having a control input that is responsive to the first transistor, the first switched current source including a first current source and a third transistor having an input and first and second outputs, the input of the third transistor forming the control input of the first switched current source, the first output of the third transistor being electrically coupled to the first current source, and the second output of the third transistor being electrically coupled to the first output of the first transistor; and a second current source having a current value that is one half a current value of the first current source, the second current source being electrically coupled to the control input of the first switched current source.

16. A circuit for providing an extremum voltage from a plurality of input voltages, the circuit comprising:

a first transistor having an input that is electrically coupled to a first of the plurality of input voltages and having a first output;

a second transistor having an input that is electrically coupled to a second of the plurality of input voltages and having a first output, the first output of the second transistor being electrically coupled to the first output of the first transistor to provide the extremum voltage;

a first switched current source that is electrically coupled to the first output of the first transistor, the first switched current source having a control input that is responsive to the first transistor, the first switched current source including a first current source and a third transistor having an input and first and second outputs, the input of the third transistor forming the control input of the first switched current source, the first output of the third transistor being electrically coupled to the first current source, and the second output of the third transistor being electrically coupled to the first output of the first transistor; and a compensating current source, the compensating current source being electrically coupled between a supply terminal and the first current source and having a control input that is electrically coupled to the first output of the first and second transistors.

17. A circuit for providing an extremum voltage from a plurality of input voltages, the circuit comprising:

a first transistor having an input that is electrically coupled to a first of the plurality of input voltages and having a first output;

a first switched current source that is electrically coupled to the first output of the first transistor, the first switched current source having a control input that is responsive to the first transistor;

a second transistor having an input that is electrically coupled to a second of the plurality of input voltages and having a first output, the first output of the second transistor being electrically coupled to the first output of the first transistor to provide the extremum voltage; and a third transistor having an input to receive the first of the plurality of input voltages, and a first output that is electrically coupled to the control input of the first switched current source.

18. The circuit of claim 17, wherein the first and third transistors each have a second output, the second output of the first transistor being electrically coupled to the second output of the third transistor, and the second output of the first and third transistors being electrically coupled to a supply terminal for receiving a supply voltage.

19. The circuit of claim 18, wherein the first switched current source includes a first current source and a fourth transistor having an input and first and second outputs, the input of the fourth transistor forming the control input of the first switched current source, the first output being electrically coupled to the first current source, and the second output being electrically coupled to the first output of the first transistor.

20. The circuit of claim 19, further comprising a second current source having a current value that is one half a current value of the first current source, the second current source being electrically coupled to both the first output of the third transistor and the control input of the first switched current source.

21. The circuit of claim 20, further comprising a compensating current source, the compensating current source being electrically coupled between the supply terminal and the first current source, and the compensating current source having a control input that is electrically coupled to the first output of the first and second transistors.

22. The circuit of claim 21, wherein the compensating current source is a fifth transistor having an input, and first and second outputs, the input being the control input of the compensating current source, the first output being electrically coupled to the first current source, and the second output being electrically coupled to the second output of the first and third transistors.

23. The circuit of claim 22, wherein the second transistor has a second output that is electrically coupled to the supply terminal, and the first output of the first, second, third, fourth, and fifth transistors is an emitter of a respective NPN transistor, the second output of the first, second, third, fourth, and fifth transistors is a collector of the respective NPN transistor, the input of the first, second, third, fourth, and fifth transistors is a base of the respective NPN transistor, and the extremum voltage is a maximum voltage.

24. A circuit for providing an extremum voltage from a plurality of input voltages, the circuit comprising:

a first transistor having an input that is electrically coupled to a first of the plurality of input voltages;

a first current source having a control input that is electrically coupled to the first transistor, and having an output that is electrically coupled to a first output of the first transistor;

a second transistor having an input that is electrically coupled to a second of the plurality of input voltages, the second transistor being electrically coupled to the first transistor to provide the extremum voltage;

a second current source having a control input that is electrically coupled to the second transistor, and having an output that is electrically coupled to a first output of the second transistor;

a third current source that is electrically coupled to the first output of the first transistor and the first output of the second transistor;

a fourth current source that is electrically coupled to a second output of the first transistor; and a fifth current source that is electrically coupled to a second output of the second transistor;

wherein the first current source includes a first controlled transistor that is electrically coupled between the first output of the first transistor and a first reference voltage terminal, the first controlled transistor having a first terminal that is electrically coupled to the first reference voltage terminal, a second terminal that is electrically coupled to the first output of the first transistor, and a control terminal that forms the control input of the first current source, the control input being electrically coupled between the fourth current source and the second output of the first transistor;

wherein the second current source includes a second controlled transistor that is electrically coupled between the first output of the second transistor and the first reference voltage terminal, the second controlled transistor having a first terminal that is electrically coupled to the first reference voltage terminal, a second terminal that is electrically coupled to the first output of the second transistor, and a control terminal that forms the control input of the second current source, the control input being electrically coupled between the fifth current source and the second output of the second transistor; and wherein the extremum voltage is a maximum voltage, the first and second transistors are NPN transistors, the first output of the first and second transistors being an emitter of the respective transistor, the second output being a collector of the respective transistor, and the input being a base of the respective transistor, and the first and second controlled transistors are P-channel transistors, the first terminal of the first and second controlled transistor being a source of the respective transistor, the second terminal being a drain of the respective transistor, and the control input being a gate of the respective transistor.

25. A circuit for providing an extremum output voltage from first and second input voltages comprising:

means for deriving the extremum output voltage from the first input voltage when the first input voltage is an extremum of the first and second input voltages;

means for deriving the extremum output voltage from the second input voltage when the second input voltage is the extremum of the first and second input voltages; and means for switching a first current that flows in a first portion of the circuit when the first input voltage is the extremum of the first and second input voltages to flow in a second portion of the circuit when the first input voltage is no longer the extremum of the first and second input voltages;

wherein the means for switching includes means for preventing the first current from affecting the means for deriving the extremum output voltage from the second input voltage when the first input voltage is no longer the extremum of the first and second input voltages.

26. The circuit of claim 25, wherein the means for deriving the extremum output voltage from the first input voltage includes means for following the first input voltage when the first input voltage is the extremum of the first and second input voltages.

27. A circuit for providing an extremum output voltage from first and second input voltages comprising:

means for deriving the extremum output voltage from the first input voltage when the first input voltage is an extremum of the first and second input voltages;

means for deriving the extremum output voltage from the second input voltage when the second input voltage is the extremum of the first and second input voltages;

means for switching a first current that flows in a first portion of the circuit when the first input voltage is the extremum of the first and second input voltages to flow in a second portion of the circuit when the first input voltage is no longer the extremum of the first and second input voltages; and means for switching a second current that flows in a third portion of the circuit when the second input voltage is the extremum of the first and second input voltages to flow in a fourth portion of the circuit when the second input voltage is no longer the extremum of the first and second input voltages.

* * * * *